United States Patent [19]

Imhof

[11] Patent Number: 4,520,551
[45] Date of Patent: Jun. 4, 1985

[54] MACHINE TOOL

[75] Inventor: Werner Imhof, Bienne, Switzerland

[73] Assignee: Posalux S.A., Bienne, Switzerland

[21] Appl. No.: 525,005

[22] Filed: Aug. 22, 1983

[30] Foreign Application Priority Data

Sep. 1, 1982 [CH] Switzerland .................. 5186/82

[51] Int. Cl.³ ............................................ B23Q 3/157
[52] U.S. Cl. ...................................... 29/568; 29/26 A
[58] Field of Search ...................... 29/568, 26 A, 26 R

[56] References Cited

U.S. PATENT DOCUMENTS

| 3,188,736 | 6/1965 | Brainard et al. | 29/568 |
| 3,973,863 | 8/1976 | Smith | 29/568 X |
| 4,486,928 | 12/1984 | Tucker et al. | 29/26 A |

FOREIGN PATENT DOCUMENTS

| 60638 | 9/1982 | European Pat. Off. | 29/568 |
| 1903499 | 8/1970 | Fed. Rep. of Germany | 29/568 |
| 2847418 | 5/1979 | Fed. Rep. of Germany | 29/568 |
| 2844088 | 5/1980 | Fed. Rep. of Germany | 29/568 |
| 82146 | 7/1981 | Japan | 29/568 |

Primary Examiner—William R. Briggs
Attorney, Agent, or Firm—Silverman, Cass & Singer, Ltd.

[57] ABSTRACT

A machine tool has a work table movable along X and Y axes parallel to the plane of the table, at least one working unit with a rotary spindle being mounted above the table. A cartridge with a matrix of perforations contains a supply of tools. The latter are taken according to requirements by tool transporting grippers, provided two for each working unit, moving along the Z axis to retract themselves into receivers or, on the contrary, to protrude therefrom, these receivers being rigid with the table. By displacing the table along the X and Y axes, the tools are selected and brought by the grippers successively opposite the spindle of a working unit. They are then brought back into the cartridge in the same manner.

8 Claims, 3 Drawing Figures

MACHINE TOOL

FIELD OF THE INVENTION

The present invention relates to a machine-tool comprising at least one work-piece carrier, at least one working unit driving a rotatable cutting tool, and means enabling relative displacement of the work-piece carrier and the working unit in two directions.

The invention is applied more particularly to machine-tools the work-piece carrier of which is constituted by a table intended to receive sheet material, especially to machines serving to work boards of printed circuits while effecting thereon such operations as drilling, shaping, milling, etc.

SUMMARY OF THE INVENTION

The object of the invention is to provide such a machine with tool changing means the capacity of which is very large, which do not add excessive weight to the movable elements of the machine, and which are simple to produce in their operation and, consequently, are of low cost.

This object is achieved by the fact that a machine according to the invention is characterized in that it comprises at least one tool carrying container and at least one tool transporting device provided with gripping means, fixed with respect to the work-piece carrier, the arrangement being such that, by relative movements of the work-piece carrier and of a working units, the transporting device can be brought opposite any tool of said container, which it grips, then be brought opposite the spindle of that working unit, into which it engages the tool, and can effect the same operation in reverse.

The various features of the invention will be apparent from the following description, drawings and claims, the scope of the invention not being limited to the drawings themselves as the drawings are only for the purpose of illustrating a way in which the principles of the invention can be applied. Other embodiments of the invention utilising the same or equivalent principles may be used and structural changes may be made as desired by those skilled in the art without departing from the present invention and the purview of the appended claims.

DESCRIPTION OF THE PREFERRED EMBODIMENTS

Figures 1, 2, 3:
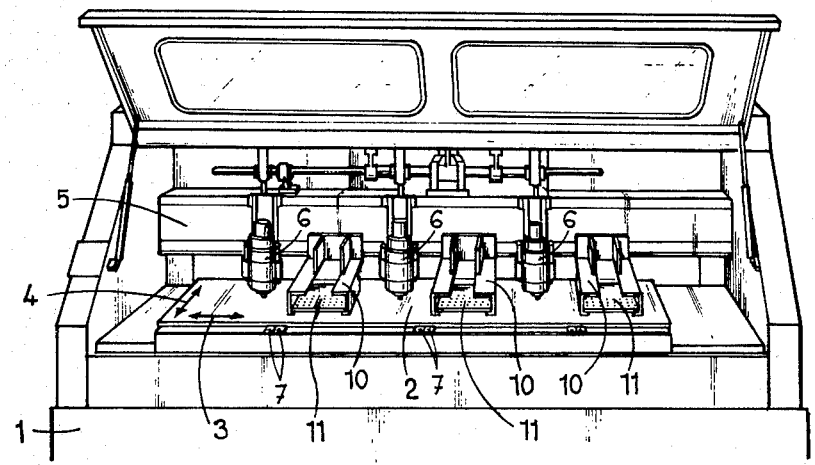
FIG. 1 is a perspective view of a machine serving to work printing circuit boards.
FIG. 2 is a perspective view of a detail of this machine, to a larger scale.
FIG. 3 is a plane view of another detail, also to a larger scale.

The machine as represented comprises a frame 1 on which a table 2 is mounted in such manner as to be able to move itself in either of two directions which are perpendicular to each other and are indicated by arrows 3 and 4 (X and Y axes). This table is intended to receive sheet material which is to be worked to produce printed circuit boards.

The machine comprises a vertical stationary bed 5 on which are mounted, in adjustable positions, three working units 6, the machine being intended to work simultaneously three printed circuit boards or three stacks of boards. A different number of the working units can be employed, from one to eight for instance. Each working unit 6 comprises a motor driving a spindle 6a intended to receive a rotatable cutting tool.

The table 2 carries, along its front edge, receivers 7 for tool-transfer grippers 8 (FIG. 2) with two receivers being provided for each working unit. The grippers 8 are arranged in such manner as to be able to be completely retracted into the receivers 7 or, on the contrary, to protrude therefrom in the course of longitudinal displacements in the direction of arrows 9 of FIG. 2, that is to say along the Z axis. The opening and the closing of the grippers 8 as well as the longitudinal displacements thereof are controlled pneumatically. One of the grippers 8 of the two receivers 7 of one working unit shown in FIG. 2 is in the extended protruding position and the other one in the retracted position. It is to be noted that alternatively the receivers could, instead of being situated along the front edge of the table 2, be situated along the rear edge of the table.

The vertical bed 5 carries three supports 10 each accompanying one of the working units and in each of which is engaged a cartridge 11 constituting a container for tools, the latter being designated by the reference 12 (FIG. 2). The cartridge is made of a plate 13 on which is superposed a cover 14 constituted by a plate thinner than the plate 13. The plate 13 and the cover 14 are secured to each other and are both provided with aligned holes 15 (FIG. 3) in a matrix arrangement. The plate 13 is moreover provided with corrugated grooves 16 which do not pass through the plate (FIG. 3) and which "bite" the holes 15, in which grooves 16 are engaged wire springs 17 also biting on said holes. These springs produce, on the portions of the tools 12 engaged within the holes 15, a frictional grip preventing the tools, which are engageable from underneath, from falling. Only a selection of the holes 15, of the grooves 16 and of the wire springs 17, has been represented in FIG. 3.

The automatic tool changes are effected as follows: in the course of displacements in the directions of the arrows 3 and 4 (X and Y axes), the table 2 brings one or the other of the receivers 7 opposite the tool 12 of the cartridge 11 it is desired to use. The gripper 8 contained in this receiver 7 then moves upwardly, extending out from the receiver, and grips the tool. The gripper 8 goes down again, together with the tool, and the table moves itself to bring the tool opposite the spindle 6a of the corresponding working unit 6. The gripper then again moves upwardly, thus engaging the gripped tool into the spindle of the working unit, and returns downwardly to retract itself again in the associated receiver 7, leaving the tool mounted on the spindle of the working unit. The reverse operation is effected to bring the tool back into the cartridge 11 once the working operation for which the tool was required has been effected.

Owing to the fact that the table carries two receivers 7 provided with two grippers 8 for each working unit, the two grippers can operate partially simultaneously, for instance during the acceleration and the braking times of the working units, which enables the working times to be shortened.

The present arrangement has the advantage of not increasing the weight of the movable elements of the machine by the addition thereto of working tools, as is the case at present with the known machines for the working of printed circuit boards in which the tools are carried by the table and successively brought opposite the spindle of the working units by the displacements of the table. Moreover, the operator can have at his disposal several cartridges, which enables him to load them with tools while out from the machine, during working operation of the latter. To this end, the cartridges are provided with feet 18 enabling them to be stored thus loaded with tools. During the changes of the working set up, the operator merely has to place fresh cartridges pre-loaded with tools on the supports 10, which is conducive to a considerable saving of time. Finally, the capacity of the tool changing device is very high without, however, this device being an undue encumberance.

I claim:

1. A machine-tool comprising: a work-piece carrier, at least one working unit that includes a spindle adapted to drive an engaged rotatable cutting tool, drive means for effecting relative movement between the work-piece carrier and said at least one working unit in two directions; at least one container fixed in position relative to said at least one working unit, said container having a plurality of tool containing positions and including at least one tool; and at least one tool transporting device fixedly mounted on said work-piece carrier, said device including gripper means able to grip tools carried in said container; so that relative movement between the work-piece carrier and said at least one working unit can align said transporting device opposite any tool containing positions in said container, at which positions said gripper means can grip any said opposed tool, and further relative motion can align said transporting device opposite said spindle, into which said gripped tool can be engaged by said gripper means, and so that by similar operation a tool can be disengaged from said spindle and be returned to said container.

2. A machine-tool as claimed in claim 1, in which said gripper means are arranged in such a way as to be able to move in a direction perpendicular to said two directions, to enable said gripper means to take the tools from the container and to bring them thereto and to place the tools into the spindle and subsequently to remove them therefrom.

3. A machine-tool as claimed in claim 1, in which the work-piece carrier is arranged in such manner as to be able to move in said two directions, and said at least one working unit is stationary.

4. A machine-tool as claimed in claim 3, in which the work-piece carrier includes a table movable along said two directions parallel to the plane of the table.

5. A machine-tool as claimed in claim 1, in which the container includes a frame and a cartridge removably mounted in said frame.

6. A machine-tool as claimed in claim 5, in which said cartridge includes a plate provided with holes into which the tools are engaged from underneath the plate.

7. A machine-tool as claimed in claim 6, in which said perforated plate includes two superposed perforated elements that are secured to each other, the holes of one element being in registered alignment with the holes of the other one, one of said elements including corrugated grooves biting the holes of this plate, there being wire springs engaged in said grooves and also biting said holes to exert on the tools engaged in the cartridge a frictional grip maintaining the tools in place.

8. A machine-tool as claimed in claim 1, in which there are two tool transporting devices on said work-piece carrier for each working unit.

* * * * *

REEXAMINATION CERTIFICATE (770th)
United States Patent [19]

Imhof

[11] B1 4,520,551

[45] Certificate Issued    Oct. 13, 1987

[54] MACHINE TOOL

[75] Inventor: Werner Imhof, Bienne, Switzerland

[73] Assignee: Posalux S.A., Bienne, Switzerland

Reexamination Request:
No. 90/001,194, Mar. 16, 1987

Reexamination Certificate for:
Patent No.: 4,520,551
Issued: Jun. 4, 1985
Appl. No.: 525,005
Filed: Aug. 22, 1983

[30] Foreign Application Priority Data

Sep. 1, 1982 [CH] Switzerland ............. 5186/82

[51] Int. Cl.[4] ............................................ B23Q 3/157
[52] U.S. Cl. .................................... 29/568; 29/26 A
[58] Field of Search ............. 29/568, 26 A; 408/1 R, 408/42–45, 49, 50, 52; 409/3, 234, 158

[56] References Cited

U.S. PATENT DOCUMENTS

| | | | |
|---|---|---|---|
| 3,288,032 | 11/1966 | Pankonin et al. | 29/568 X |
| 4,000,954 | 1/1977 | Patel | 408/3 |
| 4,088,417 | 5/1978 | Kosmowski | 408/1 |

FOREIGN PATENT DOCUMENTS

| | | | |
|---|---|---|---|
| 289508 | 4/1971 | Austria | 29/568 |
| 1808705 | 11/1968 | Fed. Rep. of Germany | 29/568 |
| 1477578 | 2/1977 | Fed. Rep. of Germany | 29/568 |
| 1920275 | 10/1978 | Fed. Rep. of Germany | 29/568 |
| 56-95560 | 8/1981 | Japan | 29/568 |
| 0028735 | 6/1984 | European Pat. Off. | 29/568 |
| 1389246 | 1/1975 | France | 29/568 |
| 1202361 | 8/1970 | United Kingdom | 29/568 |
| 1215917 | 12/1970 | United Kingdom | 29/568 |
| 1229161 | 4/1971 | United Kingdom | 29/568 |
| 1234936 | 6/1971 | United Kingdom | 29/568 |
| 1249296 | 10/1971 | United Kingdom | 29/568 |
| 1408131 | 10/1975 | United Kingdom | 29/568 |
| 2014882 | 9/1979 | United Kingdom | 29/568 |
| 2021448 | 12/1979 | United Kingdom | 29/568 |

OTHER PUBLICATIONS

"Automatische Hochleistungs-Bohr-und-Frasmaschine fur die Bearbeitung von metallischen Leiterplatten", Von Pierre A. Lautenschlager und Heinz Gerber Bienne, VDI-Z-123 (1981) Nr 17-Sep. 17, 1981, pp. 708-709.

*Primary Examiner*—William R. Briggs
*Attorney, Agent, or Firm*—Silverman, Cass, Singer & Winburn, Ltd.

[57] ABSTRACT

A machine tool has a work table movable along X and Y axes parallel to the plane of the table, at least one working unit with a rotary spindle being mounted above the table. A cartridge with a matrix of perforations contains a supply of tools. The latter are taken according to requirements by tool transporting grippers, provided two for each working unit, moving along the Z axis to retract themselves into receivers or, on the contrary, to protrude therefrom, these receivers being rigid with the table. By displacing the table along the X and Y axes, the tools are selected and brought by the grippers successively opposite the spindle of a working unit. They are then brought back into the cartridge in the same manner.

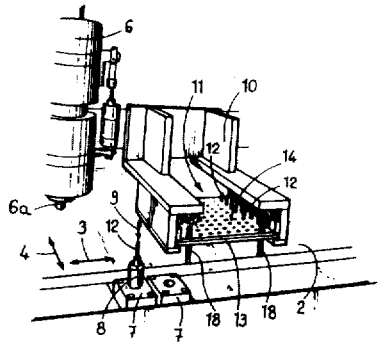

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-8 is confirmed.

* * * * *